(12) United States Patent
Thomsen et al.

(10) Patent No.: US 7,700,869 B2
(45) Date of Patent: Apr. 20, 2010

(54) SOLAR CELL LOW IRON PATTERNED GLASS AND METHOD OF MAKING SAME

(75) Inventors: Scott V. Thomsen, South Lyon, MI (US); Ksenia A. Landa, Grosse Ile, MI (US); Leonid Landa, Grosse Ile, MI (US); Richard Hulme, Rochester Hills, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1252 days.

(21) Appl. No.: 11/049,292

(22) Filed: Feb. 3, 2005

(65) Prior Publication Data

US 2006/0169316 A1    Aug. 3, 2006

(51) Int. Cl.
*H01L 25/00* (2006.01)
*H01L 31/042* (2006.01)
*C03C 3/00* (2006.01)

(52) U.S. Cl. .................. 136/243; 136/252; 501/11

(58) Field of Classification Search ............ None
See application file for complete search history.

(56) References Cited

U.S. PATENT DOCUMENTS

| | | | |
|---|---|---|---|
| 4,510,344 A | 4/1985 | Berman | |
| 4,806,436 A | 2/1989 | Tada et al. | |
| 5,214,008 A | 5/1993 | Beckwith et al. | |
| 5,747,398 A * | 5/1998 | Higby et al. | 501/66 |
| 5,851,940 A * | 12/1998 | Boulos et al. | 501/71 |
| 5,964,962 A | 10/1999 | Sannomiya et al. | |
| 5,977,477 A | 11/1999 | Shiozaki | |
| 6,372,327 B1 | 4/2002 | Burnham et al. | |
| 6,403,509 B2 | 6/2002 | Cochran et al. | |
| 6,407,021 B1 | 6/2002 | Kitayama et al. | |
| 6,498,118 B1 | 12/2002 | Landa et al. | |
| 6,506,622 B1 | 1/2003 | Shiozaki | |
| 6,521,558 B2 | 2/2003 | Landa et al. | |
| 6,573,207 B2 | 6/2003 | Landa et al. | |
| 6,610,622 B1 | 8/2003 | Landa et al. | |
| 6,716,780 B2 | 4/2004 | Landa et al. | |
| 6,796,146 B2 | 9/2004 | Burnham | |
| 2002/0102388 A1 | 8/2002 | Burnham | |
| 2003/0216241 A1 | 11/2003 | Landa et al. | |
| 2004/0121896 A1 | 6/2004 | Landa et al. | |
| 2004/0209757 A1 | 10/2004 | Landa et al. | |
| 2006/0249199 A1 | 11/2006 | Thomsen et al. | |
| 2007/0215205 A1 | 9/2007 | Thomsen et al. | |

FOREIGN PATENT DOCUMENTS

| | | |
|---|---|---|
| EP | 1 116 699 | 7/2001 |
| EP | 1 118 597 | 7/2001 |
| EP | 1 281 686 | 2/2003 |
| JP | 07-122764 | 5/1995 |
| JP | 11-60269 | 3/1999 |
| JP | 11298030 | * 10/1999 |
| WO | WO 95/13993 | * 5/1995 |
| WO | WO 2004/063106 | 7/2004 |

OTHER PUBLICATIONS

Machine Translation, JP 11-298030, Oct. 1999.*
U.S. Appl. No. 11/373,490 filed Mar. 13, 2006; Thomsen et al.
U.S. Appl. No. 11/122,218 filed May 5, 2005; Thomsen et al.

* cited by examiner

*Primary Examiner*—Jennifer K Michener
*Assistant Examiner*—Shannon Gardner
(74) *Attorney, Agent, or Firm*—Nixon & Vanderhye P.C.

(57) ABSTRACT

A patterned glass substrate is provided for use in a solar cell. The glass substrate is both patterned on at least one surface thereof and has a low iron content. The combination of low iron content, optional oxidizing agent, and the patterning of the glass substrate results in a substrate with high visible transmission and excellent light refracting characteristics.

20 Claims, 1 Drawing Sheet

SOLAR CELL LOW IRON PATTERNED GLASS AND METHOD OF MAKING SAME

Figure 1:
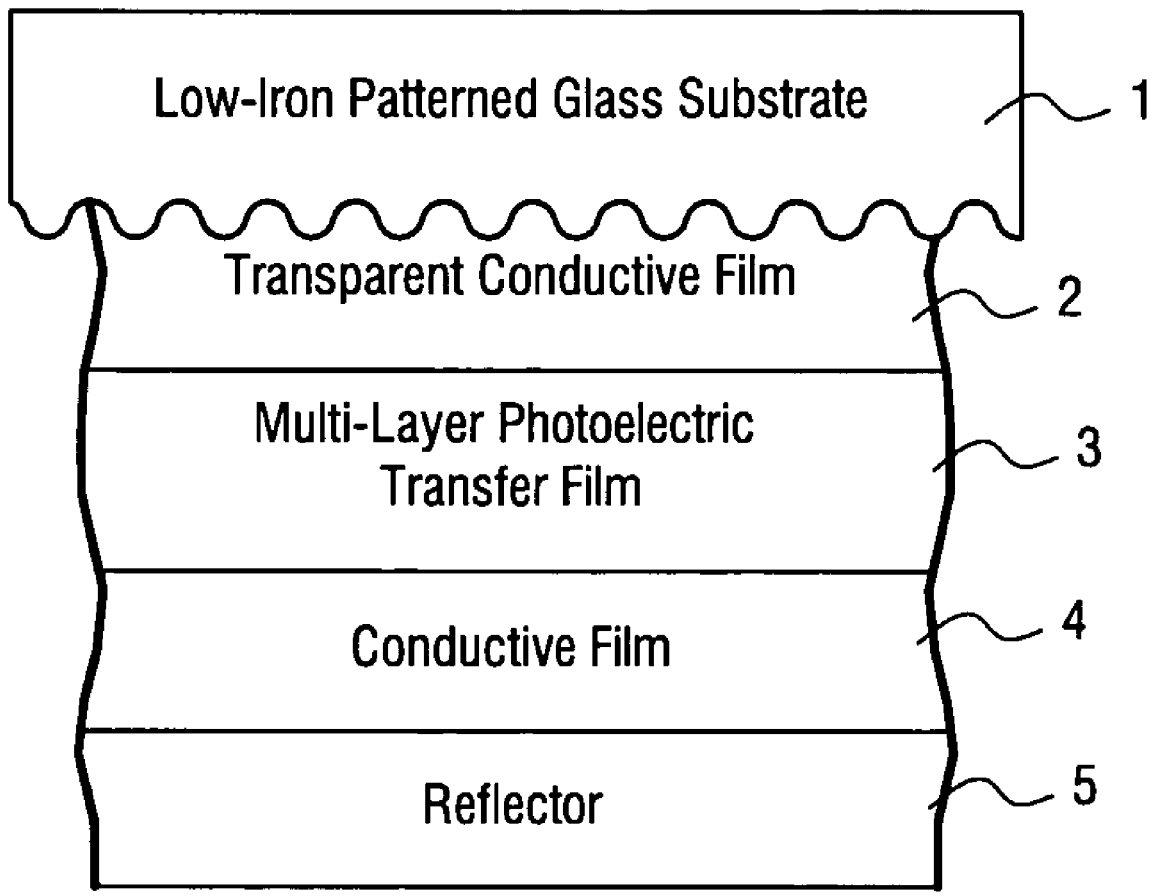

This invention relates to a patterned glass substrate for use in solar cells, and a method of making same. In certain example embodiments, the glass composition used for the patterned glass substrate is a low-iron type substrate which may optionally include cerium oxide, have a low glass redox and/or a high batch redox.

BACKGROUND AND SUMMARY OF EXAMPLE EMBODIMENTS OF THE INVENTION

Solar cells are known in the art. A solar cell may include, for example, a photoelectric transfer film made up of one or more layers located between a pair of substrate. These layers may be supported by a glass substrate. Example solar cells are disclosed in U.S. Pat. Nos. 4,510,344, 4,806,436, 6,506,622, 5,977,477, and JP 07-122764, the disclosures of which are hereby incorporated herein by reference.

Substrate(s) in a solar cell are sometimes made of glass. Glass that is fairly clear in color and highly transmissive to visible light is sometimes desirable. Glass raw materials (e.g., silica sand, soda ash, dolomite, and/or limestone) typically include certain impurities such as iron, which is a colorant. The total amount of iron present is expressed herein in terms of $Fe_2O_3$ in accordance with standard practice. However, typically, not all iron is in the from of $Fe_2O_3$. Instead, iron is usually present in both the ferrous state ($Fe^{2+}$; expressed herein as FeO, even though all ferrous state iron in the glass may not be in the form of FeO) and the ferric state ($Fe^{3+}$). Iron in the ferrous state ($Fe^{2+}$; FeO) is a blue-green colorant, while iron in the ferric state ($Fe^{3+}$) is a yellow-green colorant. The blue-green colorant of ferrous iron ($Fe^{2+}$; FeO) is of particular concern when seeking to achieve a fairly clear or neutral colored glass, since as a strong colorant it introduces significant color into the glass. While iron in the ferric state ($Fe^{3+}$) is also a colorant, it is of less concern when seeking to achieve a glass fairly clear in color since iron in the ferric state tends to be weaker as a colorant than its ferrous state counterpart.

It has been found that the use of a low-iron highly transparent patterned glass is advantageous for solar cell applications. The use of the low-iron composition in combination with the patterned surface(s) of the glass substrate(s) has been found to be advantageous with respect to optical properties, thereby leading to increased solar efficiency of a solar cell.

In certain example embodiments of this invention, a solar cell patterned glass substrate has a visible transmission of at least 75% (more preferably at least 80%, even more preferably at least 85%, and most preferably at least about 90%). In making such a glass, a batch therefor includes a base glass (e.g., soda lime silica glass) and in addition comprises (or consists essentially of in certain other embodiments) a very small amount of total iron.

Optionally, an amount of cerium oxide may also be present. In certain example embodiments, the patterned glass substrate may have fairly clear color that may be slightly yellowish (a positive b* value is indicative of yellowish color). For example, in certain example embodiments, the patterned glass substrate may be characterized by a visible transmission of at least 90%, a total solar/energy value of at least 90%, a transmissive a* color value of from −1.0 to +1.0 (more preferably from −0.5 to +0.5, and most preferably from −0.2 to 0), and a transmissive b* color value of from 0 to +1.5 (more preferably from +0.1 to +1.0, and most preferably from +0.2 to +0.7). These properties may be realized at an example non-limiting reference glass thickness of from about 3-4 mm.

In certain example embodiments of this invention, there is provided a solar cell comprising: a patterned glass substrate, wherein at least one surface of the patterned glass substrate has a surface roughness of from about 0.1 to 1.5 μm; first and second conductive layers with at least a photoelectric film provided therebetween; wherein the glass substrate is of a composition comprising:

| Ingredient | wt. % |
|---|---|
| $SiO_2$ | 67-75% |
| $Na_2O$ | 10-20% |
| CaO | 5-15% |
| total iron (expressed as $Fe_2O_3$) | 0.001 to 0.06% |
| cerium oxide | 0 to 0.30% | wherein the glass substrate has visible transmission of at least 90%, a transmissive a* color value of −1.0 to +1.0 and a transmissive b* color value of from 0 to +1.5. The amount of total iron oxide (expressed as $Fe_2O_3$) is more preferably from 0.02 to 0.06%. MgO may also be provided in the glass in certain example embodiments.

In other example embodiments of this invention, there is provided a method of making patterned glass, the method comprising: providing a molten glass batch in a furnace or melter comprising from 67-75% $SiO_2$, from about 0.001 to 0.06% (more preferably from 0.01 to 0.06%) total iron, and from about 0 to 0.30% cerium oxide; providing the glass batch so as to have a batch redox of at least 10; forwarding a glass ribbon from the furnace or melter to a nip between first and second rollers, at least one of the rollers having patter defined in a surface thereof, wherein the glass ribbon reaches the nip at a temperature of from about 1,900 to 2,400 degrees F.; at the nip, transferring the pattern from the roller(s) to the glass ribbon; the glass ribbon being at a temperature of from about 1,100 to 1,600 degrees F. upon exiting the nip; annealing the glass ribbon at least after the ribbon exits the nip, thereby providing a patterned glass having a visible transmission of at least 90%, from about 0.001 to 0.06% (more preferably from 0.01 to 0.06%) total iron, and from about 0 to 0.30% cerium oxide.

In certain example embodiments of this invention, the glass has no more than 0.07% cerium oxide, more preferably no more than 0.06%, a transmissive a* color value of −0.5 to +0.5 and a transmissive b* color value of from +0.1 to +1.0.

IN THE DRAWINGS

FIG. 1 is a cross sectional view of a solar cell according to an example embodiment of this invention.

DETAILED DESCRIPTION OF CERTAIN EXAMPLE EMBODIMENTS OF THIS INVENTION

An example solar cell is illustrated in cross section in FIG. 1. The solar cell includes, for example and without limitation, patterned glass substrate 1, conductive film 2 which may be transparent, a photoelectric transfer film 3 which may include one or more layers, a rear surface electrode 4, and an optional reflector 5. In certain example embodiments, the photoelectric transfer film 3 may include a p-type silicon inclusive layer, an i-type silicon inclusive layer, and an n-type silicon inclusive layer. These silicon inclusive layers may be composed of amorphous silicon or any other suitable type of semiconductor with suitable dopants in certain example embodiments of this invention. The electrodes 2, 4 may be of a transparent conductor such as zinc oxide, or any other suitable material in certain example embodiments of this invention, and the reflector 5 may be of aluminum, silver or the like.

Light tends to be refracted at interface(s) resulting from the patterning of the glass substrate 1, thereby causing light to proceed through the semiconductor layer(s) at an angle(s) such that the path is longer. As a result, more light can be absorbed by the solar cell and output current and/or efficiency can be improved/increased.

In certain example embodiments of this invention, the patterned surface(s) of the glass substrate 1 has a surface roughness (between peaks/valleys) of from about 0.1 to 1.5 µm, more preferably from about 0.5 to 1.5 µm.

In certain example embodiments of this invention, the glass substrate 1 has one or more surfaces which are patterned so as to have a waviness feature defined therein. In the FIG. 1 embodiment, only one surface of the glass substrate 1 is patterned, although in other example embodiments both surfaces of the glass substrate may be patterned.

The patterning is preferably defined in the glass substrate 1 during the process of making the glass. An example technique for making such patterned glass is as follows. A furnace or melter is provided, as are first and second opposing rollers which define a nip therebetween. At least one of the rollers has a pattern defined in a surface thereof, where the pattern is made up of a plurality of peaks and valleys. A ribbon of glass exiting the furnace or melter is fed into the nip between the patterning rollers and reaches the nip at a temperature of from about 1,900 to 2,400 degrees F. At the nip, the pattern(s) from the roller(s) is transferred to the ribbon of glass, and then the patterned glass ribbon exits the nip at a temperature of from about 1,100 to 1,600 degrees F. After leaving the nip, the patterned glass ribbon is annealed, and may then be cut into a plurality of sheets. These glass sheets may or may not be heat treated (e.g., thermally tempered), and may be used in solar cell applications such as shown in FIG. 1. Example techniques for making the patterned glass substrate 1 are illustrated and described in U.S. Pat. Nos. 6,796,146 and/or 6,372,327 (except that different types of patterns are used), the disclosures of which are hereby incorporated herein by reference.

Certain glasses for patterned substrate 1 according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients:

TABLE 1

EXAMPLE BASE GLASS

| Ingredient | Wt. % |
|---|---|
| $SiO_2$ | 67-75% |
| $Na_2O$ | 10-20% |
| CaO | 5-15% |
| MgO | 0-7% |
| $Al_2O_3$ | 0-5% |
| $K_2O$ | 0-5% |
| $Li_2O$ | 0-1.5% |
| BaO | 0-1% |

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO.

In addition to the base glass (e.g., see Table 1 above), in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., cerium and/or the like). In certain example embodiments of this invention, the resulting glass has visible transmission of at least 75%, more preferably at least 80%, even more preferably of at least 85%, and most preferably of at least about 90% (sometimes at least 91%) (Lt D65). In certain example non-limiting instances, such high transmissions may be achieved at a reference glass thickness of about 3 to 4 mm In certain embodiments of this invention, in addition to the base glass, the glass and/or glass batch comprises or consists essentially of materials as set forth in Table 2 below (in terms of weight percentage of the total glass composition):

TABLE 2

EXAMPLE ADDITIONAL MATERIALS IN GLASS

| Ingredient | General (Wt. %) | More Preferred | Most Preferred |
|---|---|---|---|
| total iron (expressed as $Fe_2O_3$): | 0.001-0.06% | 0.005-0.04% | 0.01-0.03% |
| cerium oxide: | 0-0.30% | 0.01-0.12% | 0.01-0.07% |
| $TiO_2$ | 0-1.0% | 0.005-0.1% | 0.01-0.04% |

In certain example embodiments, the total iron content of the glass is more preferably from 0.01 to 0.06%, more preferably from 0.01 to 0.04%, and most preferably from 0.01 to 0.03%.

In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material. It is noted that while the presence of cerium oxide is preferred in many embodiments of this invention, it is not required in all embodiments and indeed is intentionally omitted in many instances. In certain example embodiments of this invention, cerium oxide (e.g., $CeO_2$) may be either replaced or supplemented by $NaNO_3$ in the glass batch.

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

According to certain example embodiments of this invention, the optional presence of cerium oxide (e.g., $CeO_2$) as an oxidizer in the glass batch acts as a chemical decolorizer since during melting of the glass batch it causes iron in the ferrous state ($Fe^{2+}$; FeO) to oxidize to the ferric state ($Fe^{3+}$) by providing oxygen as illustrated by the following equation:

$$Fe^{2+}+Ce^{4+}=Fe^{3+}+Ce^{3+} \quad (1)$$

or

$$FeO+CeO_2=Fe_2O_3+Ce_2O_3 \quad (1a)$$

Equation (1) shows that the presence of cerium oxide in the glass batch causes an amount of the strong blue-green colorant of ferrous iron ($Fe^{2+}$; FeO) to oxidize into the weaker yellow-green ferric iron colorant ($Fe^{3+}$) during the glass melt (note: some ferrous state iron will usually remain in the resulting glass, as potentially may some $Ce^{4+}$). Accordingly, a significant portion of the $CeO_2$ added to the original glass batch prior to the melt is transformed during the melt into $Ce_2O_3$ which is present in the resulting glass. The aforesaid oxidation of the iron tends to reduce coloration of the glass and also causes visible transmission to increase. It is noted that, like $Fe_2O_3$, the phrase "cerium oxide" as used herein refers to total cerium oxide (i.e., including cerium oxide in both the $Ce^{4+}$ and $Ce^{3+}$ states).

Any yellowish color caused by oxidation of iron into ferric state ($Fe^{3+}$) iron (i.e., positive b*) is acceptable in solar cell applications and need not be compensated for by addition of other colorants thereby saving cost in certain example embodiments of this invention.

As mentioned above, the optional cerium oxide may be replaced by, or supplemented with, other oxidizing agents (sources of oxygen) such as sulfates or nitrates. In embodiments where sodium nitrate ($NaNO_3$) is provided in the glass, it functions in a manner similar to cerium oxide (but note the potential for oxygen bubbles). In particular, like cerium oxide, sodium nitrate can be added to the glass batch as an oxidizer to cause an amount of the strong blue-green colorant of ferrous iron ($Fe^{2+}$; FeO) to oxidize into the weaker yellow-green ferric iron colorant ($Fe^{3+}$) during the glass melt (note: some ferrous state iron will usually remain in the resulting glass).

Those skilled in the art will recognize that the most of the nitrate (e.g., sodium nitrate) added to the glass batch decomposes during the melt so that some burns off as NO, while other parts of it end up in the glass as $Na_2O$. While sodium nitrate ($NaNO_3$) may be utilized as an oxidizer, the instant invention is not so limited. For example, other nitrates (e.g., potassium nitrate $KNO_3$, or any other suitable nitrate) may be used instead of or in addition to sodium nitrate in alternative embodiments of this invention. In certain example embodiments of this invention, from about 0 to 2.0%, more preferably from about 0.3 to 1.2% when desired, of sodium nitrate may be used in the batch in the process of manufacture.

It will be appreciated by those skilled in the art that the optional addition of cerium oxide and/or sodium nitrate (see equations (1) and (2) above) results in a glass with a lower "redox" value (i.e., less iron in the ferrous state FeO). In this regard, the proportion of the total iron in the ferrous state (FeO) is used to determine the redox state of the glass, and redox is expressed as the ratio $FeO/Fe_2O_3$, which is the weight percentage (%) of iron in the ferrous state (FeO) divided by the weight percentage (%) of total iron (expressed as $Fe_2O_3$) in the resulting glass. Due to at least the presence of the cerium oxide and/or sodium nitrate, the redox of glass according to certain example embodiments of this invention is rather low; in particular, glass according to certain example embodiments of this invention may have a redox value (i.e., $FeO/Fe_2O_3$) of less than or equal to 0.20, more preferably less than or equal to 0.15; even more preferably less than or equal to 0.10. In certain example embodiments of this invention, the glass of substrate 1 may have a glass redox (i.e., $FeO/Fe_2O_3$) of less than or equal to 0.01.

Moreover, resulting glass according to certain example embodiments of this invention may include iron in the ferrous state (FeO) in an amount (wt. %) of less than or equal to 0.020%, more preferably less than or equal to 0.010%, and most preferably less than or equal to 0.004%.

It is noted that glass according to certain example embodiments of this invention is often made via the known float process in which a tin bath is utilized. It will thus be appreciated by those skilled in the art that as a result of forming the glass on molten tin in certain exemplary embodiments, small amounts of tin or tin oxide may migrate into surface areas of the glass on the side that was in contact with the tin bath during manufacture (i.e., typically, float glass may have a tin oxide concentration of 0.05% or more (wt.) in the first few microns below the surface that was in contact with the tin bath).

In view of the above, glasses according to certain example embodiments of this invention achieve a neutral or substantially clear color and/or high visible transmission. In certain embodiments, resulting glasses according to certain example embodiments of this invention may be characterized by one or more of the following transmissive optical or color characteristics when measured at a thickness of from about 1 mm-6 mm (most preferably a thickness of about 3-4 mm; this is a non-limiting thickness used for purposes of reference only) (Lta is visible transmission %). It is noted that in the table below the a* and b* color values are determined per Ill. D65, 10 degree Obs.

TABLE 3

GLASS CHARACTERISTICS OF EXAMPLE EMBODIMENTS

| Characteristic | General | More Preferred | Most Preferred |
|---|---|---|---|
| Lta (Lt D65): | >=85% | >=90% | >=91% |
| % τe (ISO 9050): | >=85% | >=90% | >=91% |
| % FeO (wt. %): | <=0.020% | <=0.005% | <=0.004% |
| L* (Ill. D65, 10 deg.): | 90-98 | n/a | n/a |
| a* (Ill. D65, 10 deg.): | −1.0 to +1.0 | −0.5 to +0.5 | −0.2 to 0.0 |
| b* (Ill. D65, 10 deg.): | 0 to +1.5 | +0.1 to +1.0 | +0.2 to +0.7 |

The aforesaid characteristics of the glass substrate 1 are for the glass substrate alone, not the overall solar cell or solar cell module.

As can be seen from Table 3 above, glasses for substrate 1 of certain embodiments of this invention achieve desired features of fairly clear color and/or high visible transmission, with slightly positive b* color in certain embodiments, while not requiring iron to be eliminated from the glass composition. This may be achieved through the provision of the unique material combinations described herein.

Examples 1-6

Example glasses for substrates 1 were made and tested according to example embodiments of this invention. Glasses of this invention may be made from batch ingredients using well known glass melting and refining techniques. The compositions of the glass batches according to the examples are set forth below, with like amounts ending up in the final glass. All amounts of ingredients are in terms of weight percentage.

TABLE 4

EXAMPLES

| Compound | Ex. 1 | Ex. 2 | Ex. 3 | Ex. 4 | Ex. 5 | Ex. 6 |
|---|---|---|---|---|---|---|
| $SiO_2$: | 73.39 | 70.66 | 71.01 | 71.14 | 70.98 | 71.37 |
| $Na_2O$: | 13.78 | 13.89 | 13.86 | 13.88 | 13.85 | 14.02 |
| CaO: | 10.45 | 9.82 | 9.54 | 9.67 | 9.59 | 9.70 |
| MgO | 0.07 | 4.1 | 4.01 | 4.12 | 4.08 | 4.31 |
| $Al_2O_3$: | 0.93 | 0.71 | 0.33 | 0.33 | 0.32 | 0.164 |
| $K_2O$: | 0.05 | 0.38 | 0.16 | 0.16 | 0.16 | 0.028 |
| $SO_3$: | 0.284 | 0.322 | 0.338 | 0.329 | 0.310 | 0.306 |
| $TiO_2$: | 0.023 | 0.017 | 0.012 | 0.012 | 0.012 | 0.011 |
| $Fe_2O_3$ (total iron): | 0.023 | 0.025 | 0.026 | 0.028 | 0.026 | 0.029 |
| Cerium oxide: | 0 | 0 | 0 | 0 | 0.04 | 0.07 |

The batches were melted and glass formed using known techniques. Solar characteristics for the resulting Example glasses were as follows in the table below, with the below measurements taken after the melt and formation of the glass. It is noted that Lta (visible transmission %) was measured in accordance with Ill. D65, %τe (total energy) was measured in accordance with ISO 9050 (incorporated herein by reference), and transmissive L*, a* and b* color coordinates (CIE) were measured using Ill. D65, 10 degree observer. All samples were from 3-4 mm thick. Note that the batch redox is indicative of the redox of the batch, as opposed to the final glass, whereas the glass redox is the redox of the final glass.

In certain example embodiments of this invention, it has been found that the use of a positive batch redox of at least 10, more preferably at least 15, and most preferably at least 18, permits an improved solar cell applicable glass to be made.

Once given the above disclosure many other features, modifications and improvements will become apparent to the skilled artisan. Such features, modifications and improvements are therefore considered to be a part of this invention, the scope of which is to be determined by the following claims:

What is claimed is:

1. A photovoltaic device comprising:
   a patterned glass substrate, wherein at least one surface of the patterned glass substrate has a surface roughness of from about 0.1 to 1.5 μm;
   first and second conductive layers with at least a photoelectric film provided therebetween;
   wherein the glass substrate is of a composition comprising:

| Ingredient | wt. % |
|---|---|
| $SiO_2$ | 67-75% |
| $Na_2O$ | 10-20% |
| CaO | 5-15% |
| total iron (expressed as $Fe_2O_3$) | 0.001 to 0.06% |
| cerium oxide | 0 to 0.30% | wherein the glass substrate has visible transmission of at least 90%, a transmissive a* color value of −1.0 to +1.0 and a transmissive b* color value of from 0 to +1.5, and wherein colorant portion of said composition consists essentially of 0.001 to 0.06% total iron (expressed as $Fe_2O_3$) and 0 to 0.30% cerium oxide.

2. The photovoltaic device of claim 1, wherein the glass substrate comprises:

| | |
|---|---|
| total iron (expressed as $Fe_2O_3$) | 0.02 to 0.04% |
| cerium oxide | 0 to 0.07%. |

3. The photovoltaic device of claim 1, wherein the glass substrate comprises:

| | |
|---|---|
| total iron (expressed as $Fe_2O_3$) | 0.01 to 0.03% |
| cerium oxide | 0.01 to 0.07%. |

CHARACTERISTICS OF EXAMPLES 1–6 GLASSES

| Characteristic | Ex. 1 | Ex. 2 | Ex. 3 | Ex. 4 | Ex. 5 | Ex. 6 |
|---|---|---|---|---|---|---|
| % Lta | 91.64 | 91.45 | 91.33 | 91.18 | 91.73 | 91.53 |
| % τe | 91.52 | 91.22 | 91.11 | 91.03 | 91.65 | 91.37 |
| $Fe_2O_3$ (total iron %): | 0.023 | 0.025 | 0.026 | 0.028 | 0.026 | 0.029 |
| FeO (wt. %) | 0.0026 | 0.0018 | 0.0012 | 0.0015 | 0.0002 | 0.0001 |
| L* | 96.67 | 96.54 | 96.51 | 96.41 | 96.68 | 96.66 |
| a* | −0.11 | −0.16 | −0.06 | −0.09 | −0.08 | −0.06 |
| b* | +0.24 | +0.38 | +0.46 | +0.51 | +0.37 | +0.54 |
| Glass Redox: | 0.11 | 0.07 | 0.05 | 0.05 | 0.008 | 0.003 |
| Batch Redox: | +15 | +18 | +20 | +20 | +22 | +24 |

4. The photovoltaic device of claim 1, wherein the glass substrate has a visible transmission of at least 90%.

5. The photovoltaic device of claim 1, wherein the glass substrate has a positive b* color value.

6. The photovoltaic device of claim 1, wherein the glass substrate has a redox value ($FeO/Fe_2O_3$) no greater than 0.10.

7. The photovoltaic device of claim 1, wherein the glass substrate has a redox value ($FeO/Fe_2O_3$) no greater than 0.01.

8. The photovoltaic device of claim 1, wherein the glass substrate has a total solar and/or total energy value τe of at least 90%.

9. The photovoltaic device of claim 1, wherein the glass substrate comprises less than or equal to 0.005% FeO.

10. The photovoltaic device of claim 1, wherein the glass substrate comprises less than or equal to 0.004% FeO.

11. The photovoltaic device of claim 1, wherein the glass substrate is substantially free of two or more of erbium oxide, nickel oxide, cobalt oxide, neodymium oxide, chromium oxide, and selenium.

12. The photovoltaic device of claim 1, wherein the glass substrate is substantially free of each of erbium oxide, nickel oxide, cobalt oxide, neodymium oxide, chromium oxide, and selenium.

13. The photovoltaic device of claim 1, wherein the glass substrate is substantially free of erbium oxide and nickel oxide.

14. The photovoltaic device of claim 1, wherein at least one surface of the patterned glass substrate is patterned so as to have has a surface roughness of from about 0.5 to 1.5 μm.

15. The photovoltaic device of claim 1, wherein both surfaces of the glass substrate are patterned.

16. The photovoltaic device of claim 1, wherein the glass substrate includes no more than 0.07% cerium oxide, more preferably no more than 0.06% cerium oxide.

17. The photovoltaic device of claim 1, wherein the glass substrate has a transmissive a* color value of −0.5 to +0.5 and a transmissive b* color value of from +0.1 to +1.0.

18. The photovoltaic device of claim 1, wherein the composition of the glass substrate has a total iron content of from 0.02 to 0.06%.

19. The photovoltaic device of claim 1, wherein the composition of the glass substrate includes more cerium oxide than total iron oxide.

20. A solar cell comprising:
a glass substrate;
a photoelectric film supported by at least the glass substrate;
wherein the glass substrate is of a composition having a colorant portion consisting essentially of:

| Ingredient | wt. % |
| --- | --- |
| total iron (expressed as $Fe_2O_3$) | 0.01 to 0.06% |
| cerium oxide | 0 to 0.30% | wherein the glass substrate has visible transmission of at least 90%, a transmissive a* color value of −1.0 to +1.0 and a positive transmissive b* color value.

* * * * *